United States Patent
Chang et al.

(10) Patent No.: US 10,103,841 B2
(45) Date of Patent: Oct. 16, 2018

(54) METHOD AND DEVICE FOR DE-PUNCTURING TURBO-CODED DIGITAL DATA, AND TURBO DECODER SYSTEM

(71) Applicant: NATIONAL CHIAO TUNG UNIVERSITY, Hsinchu (TW)

(72) Inventors: Hsie-Chia Chang, Hsinchu (TW); Chen-Yang Lin, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 15/439,697

(22) Filed: Feb. 22, 2017

(65) Prior Publication Data

US 2018/0062789 A1    Mar. 1, 2018

(30) Foreign Application Priority Data

Aug. 26, 2016  (TW) .............................. 105127390 A

(51) Int. Cl.
*H03M 13/00* (2006.01)
*H04L 1/00* (2006.01)
*H03M 13/25* (2006.01)

(52) U.S. Cl.
CPC ........ *H04L 1/0047* (2013.01); *H03M 13/005* (2013.01); *H03M 13/258* (2013.01); *H03M 13/6508* (2013.01); *H04L 1/0057* (2013.01)

(58) Field of Classification Search
CPC .. H04L 1/0047; H04L 1/0057; H03M 13/005; H03M 13/258; H03M 13/6508
See application file for complete search history.

(56) References Cited

U.S. PATENT DOCUMENTS 5,511,082 A    4/1996    How
8,332,734 B2  12/2012    Kim et al.
(Continued)

OTHER PUBLICATIONS

C.-Y. Lin, C.-C. Wong, and H.-C. Chang, "A 40 nm 535 Mbps Multiple Code-Rate Turbo Decoder Chip Using Reciprocal Dual Trellis," IEEE Journal of Solid-State Circuits, vol. 48, No. 11, pp. 2662-2670, Nov. 2013.

(Continued)

*Primary Examiner* — Sam Rizk
(74) *Attorney, Agent, or Firm* — Lewis Roca Rothgerber Christie LLP

(57) ABSTRACT

A turbo decoder system decodes L-length digital data consisting of a systematic code and $1^{st}$ and $2^{nd}$ parity check codes, and includes a trellis controller obtaining the ratio of the bit-number Ep of the $1^{st}/2^{nd}$ parity check code to the bit-number D of an original systematic code and generating, based on the code rate of the digital data, a trellis control output indicating a target decoding trellis, which is selected by a turbo decoder to perform decoding operations. A zero-patch module patches zeros into the systematic code, and patches, based on the value of Ep/D, one or more zeros into the $1^{st}/2^{nd}$ parity check code so that parity check bits of the $1^{st}/2^{nd}$ parity check code and the zero-bit(s) form a periodically depunctured parity check code.

10 Claims, 10 Drawing Sheets

(56) References Cited

U.S. PATENT DOCUMENTS 8,386,902 B1 2/2013 Gloudemans
2016/0285588 A1* 9/2016 Hald .................. H04Q 9/00

OTHER PUBLICATIONS

C. Roth, S. Belfanti, C. Benkeser, and Q. Huang, "Efficient Parallel Turbo-Decoding for High-Throughput Wireless Systems," To Appear In IEEE Transactions on Circuits and Systems—I: Regular Papers. 2012.
F. Naessens, et al., "A 1037 mm2 675 mW reconfigurable LDPC and Turbo encoder and decoder for 802.11n, 302.16e and 3GPP-LTE," Symposium on VLSI Circuits Digest of Technical Papers, Honolulu, HI, Jun. 2010, pp. 213-214.

* cited by examiner

METHOD AND DEVICE FOR DE-PUNCTURING TURBO-CODED DIGITAL DATA, AND TURBO DECODER SYSTEM

CROSS-REFERENCE TO RELATED APPLICATION

This application claims priority of Taiwanese Patent Application No. 105127390, filed on Aug. 26, 2016.

FIELD

The disclosure relates to turbo codes, and more particularly to a method and device for de-puncturing turbo-coded digital data, and a turbo decoder system.

BACKGROUND

Turbo codes are a kind of error correction codes, and have been prevalently applied to a variety of wireless communication systems due to their exceptional error correction ability.

In a transmitter, for example, referring to FIG. 1, a conventional turbo encoder is used to encode information bits as an input code, and generally includes two convolutional encoders 11, 12, an interleaver 13 and a puncture module 14. The input code is encoded in normal and interleaved order phases. Along with the input code, i.e., systematic bits, first parity check bits as a first parity check code and second parity check bits as a second parity check code are produced respectively in the normal and interleaved order phases. Before transmitting the input code and the first and second parity check codes through a wireless communication channel, the puncture module 14 conducts puncturing operations for the input code and the first and second parity check codes by deleting some code bits from the input code and the parity check codes to raise the transmission code rate. Puncturing operations are categorized into periodical and non-periodical types. The periodical puncturing implies that bit positions and the number of punctured bits are the same in every period of the code.

Referring to FIG. 2, an example of encoding and puncturing operations for a 15-bit data code, denoted as $S_{00}S_{01}S_{02}S_{03}S_{04}S_{05}S_{06}S_{07}S_{08}S_{09}S_{10}S_{11}S_{12}S_{13}S_{14}$, is shown. In the beginning, a rate-1/2 encoder (not shown) of a transmitter encodes the 15-bit data code to produce an output that includes a 15-bit parity check code denoted as $P_{00}P_{01}P_{02}P_{03}P_{04}P_{05}P_{06}P_{07}P_{08}P_{09}P_{10}P_{11}P_{12}P_{13}P_{14}$ and the 15-bit data code. Then, in a puncturing operation, 12 parity bits are deleted from the 15-bit parity check code (but no data bit is deleted from the data code in this example) to thereby produce a punctured 15-bit parity check code denoted as $P_{00}P_{03}****P_{12}$, where "*" denotes a punctured bit.

In a receiver, for example, referring to FIG. 3, a conventional turbo decoder system is used to decode received turbo codes, e.g., the data code and the first and second parity check codes (i.e., systematic bits, first parity check bits and second parity check bits) punctured by and transmitted from the transmitter, between the normal and interleaved order phases iteratively. The conventional turbo decoder system includes a depuncture module 21, and an iterative decoder 20 that consists of two soft-in/soft-out (SISO) decoders 22, 23, two interleavers 25, 26 and a deinterleaver 24. Before iterative decoding, in order to reconstruct original codes, for example, the non-punctured data code and the non-punctured parity check codes, the depuncture module 21 conducts depuncturing operations by inserting zeros into each received code respectively at all punctured bit positions, thereby extending the length of the received code to its non-punctured length. In other words, each depunctured code can be deemed as the original non-punctured code by the turbo decoder.

Referring again to FIG. 2, as the same example, in the de-puncturing operation of a receiver, 12 zeros denoted as "0" are inserted into the received parity check code respectively at all the punctured bit positions to thereby produce a depunctured 15-bit parity check code denoted as $P_{00}00P_{03}00000000P_{12}00$.

In each decoding phase of a SISO decoder, a SISO algorithm proposed in a first article by Hagenauer, E. Offer, and L. Papke, "Iterative decoding of binary block and convolutional codes," IEEE Trans. Inf. Theory, vol. 42, no. 2, pp. 429-445, March 1996, is performed, and an extrinsic value for each data symbol is produced. These extrinsic values are delivered into a next decoding phase as the a priori input(s) for each dedicated data symbol. By updating and exchanging soft values in each decoding phase, reliable log likelihood ratio (LLR) of a posteriori value(s) for each data symbol can be obtained to achieve better bit error rate (BER).

A decoding trellis is essential to the SISO decoders for performing the SISO algorithm and delivering the soft values. Adopted to execute maximum a posteriori probability (MAP) proposed in a second article by L. R. Bahl, J. Cocke, F. Jelinek, and J. Raviv, "Optimal decoding of linear codes for minimizing symbol error rate," IEEE. Trans. Inf. Theory, vol. IT-20, pp. 284-287, March 1974 are two types of decoding trellises. One is a conventional trellis, and the other is a reciprocal dual trellis proposed in S. Riedel, "Symbol-by-symbol MAP decoding algorithm for high-rate convolutional codes that use reciprocal dual codes," *IEEE J. Sel. Areas Commun.*, vol. 16, no. 2, pp. 175-185, February 1998. To save hardware resources and output latency, a sliding window (SW) decoding schedule disclosed in a third article by S. A. Barbulescu, "Sliding window and interleaver design," IET Electronics letters, vol. 37, no. 21, pp. 1299-1300, October 2001, is generally applied in the turbo decoder.

The SISO decoders with the conventional trellis can achieve good hardware efficiency for low code rate operations, for example, 1 Gbps throughput at 966 mW power consumption disclosed in a fourth article by C. Roth, S. Belfanti, C. Benkeser, and Q. Huang, "Efficiency parallel turbo decoding for high throughput wireless systems," IEEE Trans. Circuits Syst. I, vol. 58, no. 6, pp. 1412-1420, June 2014. While the conventional trellis is applied to carry out MAP algorithm, the size of SW has to be enlarged to maintain good error correction ability as the operation code rate rises. It is noted that, in high code rate operations, the SISO decoders with the conventional trellis may suffer from relatively long decoding latency and relatively large circuit area because a wide size of SW is required.

In order to solve the aforementioned issues, the SISO decoders with the reciprocal dual trellis, as disclosed in a fifth article by C.-Y. Lin, C.-C. Wong, and H.-C. Chang, "A 40 nm 535 Mbps multiple code-rate turbo decoder chip using reciprocal dual trellis," IEEE J. Solid-state Circuits, vol. 48, no. 11, pp. 2662-2670, November 2013, have been proven to have better hardware efficiency, i.e., higher throughput per area (Mbps/k-gates), for high rate code operations. The SW decoding schedule can be applied to the SISO decoders with the reciprocal dual trellis for producing LLR. Therefore, for the iterative decoder 20 of FIG. 3, some computation units in the SISO decoders 22, 23 can be shared when integrating the reciprocal dual trellis and the conventional trellis. While decoding periodically punctured codes, parallel LLR computation units in the reciprocal dual trellis have to be activated simultaneously to boost decoding speed. However, the SISO decoders with the reciprocal dual trellis are limited to applications of periodically punctured codes.

Therefore, turbo decoders with a single one of the aforementioned decoding trellises may not conform to high-throughput requirements for arbitrary code rate operations.

SUMMARY

Therefore, an object of the disclosure is to provide a method and device for de-puncturing turbo-coded digital data, and a turbo decoder system that can overcome at least one of the aforesaid drawbacks of the prior art.

According to one aspect of the disclosure, there is provided a method of de-puncturing turbo-coded digital data implemented by a de-puncturing device. The turbo-coded digital data corresponds to transmitted turbo-coded digital data that is obtained by puncturing original turbo-coded digital data based on a predetermined wireless communication protocol. The original turbo-coded digital data includes a D-bit systematic code, and a D-bit parity check codes for error correction. The turbo-coded digital data has an L-bit length, and includes a systematic code, which consists of a plurality of systematic bits, and a parity check code, which consists of a plurality of parity check bits. The method includes the steps of:

a) obtaining a number $E_p$ of the parity check bits of the parity check code of the turbo-coded digital data based on L, D, and a puncture parameter defined by the predetermined wireless communication protocol and associated with a number of punctured bits from the D-bit systematic code, where $E_p$ is a positive integer;

b) when there is any punctured bit existing in the systematic code of the turbo-coded digital data, patching one or more zeros into the systematic code of the turbo-coded digital data respectively at bit position(s) of the punctured bit(s) to form a depunctured systematic code; and c) patching, based on the value of $E_p/D$, at least one zero into the parity check code of the turbo-coded digital data in a manner that the parity check bits and the at least one patched zero-bit are arranged in bit-position to form a periodically depunctured parity check code that cooperates with the depunctured systematic code to constitute depunctured turbo-coded digital data corresponding to the turbo-coded digital data.

According to another aspect of the disclosure, there is provided a device for de-puncturing turbo-coded digital data to generate a depunctured turbo-coded digital data. The turbo-coded digital data corresponds to a transmitted turbo-coded digital data that is obtained by puncturing an original turbo-coded digital data based on a predetermined wireless communication protocol. The original turbo-coded digital data includes a D-bit systematic code, and two D-bit parity check codes for error correction. The turbo-coded digital data has an L-bit length, and includes a systematic code, which consists of a plurality of systematic bits, and a parity check code, which consists of a plurality of parity check bits. The device includes a trellis controller and a zero-patch module.

The trellis controller is configured to obtain a number $E_p$ of the parity check bits of the parity check code of the turbo-coded digital data based on L, D, and a puncture parameter defined by the predetermined wireless communication protocol and associated with a number of punctured bits from the D-bit systematic code, where $E_p$ is a positive integer, to calculate the value of $E_p/D$, and to generate, based on the code rate of the turbo-coded digital data, a trellis control output that indicates a target one of different decoding trellises to be used by a turbo decoder to decode the depunctured turbo-coded digital data.

The zero-patch module is used to receive the turbo-coded digital data, and is connected electrically to the trellis controller for receiving the value of $E_p/D$ therefrom. The zero-patch module is configured to patch, when there is any punctured bit existing the systematic code of the turbo-coded digital data, one or more zeros into the systematic code of the turbo-coded digital data respectively at bit position(s) of the punctured bit(s) to form a depunctured systematic code, and to patch, based on the value of $E_p/D$, at least one zero into the parity check code of the turbo-coded digital data in a manner that the parity check bits and the at least one patched zero-bit are arranged in bit-position to form a periodically depunctured parity check code that cooperates with the depunctured systematic code to constitute the depunctured turbo-coded digital data.

According to still another aspect of the disclosure, there is provided a turbo decoder system for decoding turbo-coded digital data. The turbo-coded digital data corresponds to a transmitted turbo-coded digital data that is obtained by puncturing an original turbo-coded digital data based on a predetermined wireless communication protocol. The original turbo-coded digital data includes a D-bit systematic code, and a D-bit first parity check code and a D-bit second parity check code for error correction. The turbo-coded digital data has an L-bit length, and includes a systematic code, which consists of a plurality of systematic bits, a first parity check code, which consists of a plurality of first parity check bits, and a second parity check code, which consists of a plurality of second parity check bits. The turbo decoder system includes a trellis controller, a zero-patch module and a turbo decoder.

The trellis controller is configured to obtain a number $E_p$ of the first/second parity check bits of the first/second parity check code of the turbo-coded digital data based on L, D, and a puncture parameter defined by the predetermined wireless communication protocol and associated with a number of punctured bits from the D-bit systematic code, where $E_p$ is a positive integer, to calculate the value of $E_p/D$, and to generate, based on the code rate of the turbo-coded digital data, a trellis control output that indicates a target one of different decoding trellises.

The zero-patch module is used to receive the turbo-coded digital data, and is connected electrically to the trellis controller for receiving the value of $E_p/D$ therefrom. The zero-patch module is configured to patch, when there is any punctured bit existing in the systematic code of the turbo-coded digital data, one or more zeros into the systematic code of the turbo-coded digital data respectively at bit position(s) of the punctured bit(s) to form a depunctured systematic code, and to patch, based on the value of $E_p/D$, at least one zero into each of the first and second parity check codes of the turbo-coded digital data in a manner that the first parity check bits and the at least one patched zero-bit are arranged in bit-position to form a periodically depunctured first parity check code, and that the second parity check bits and the at least one patched zero-bit are arranged in bit position to form a periodically depunctured second parity check code.

The turbo decoder is connected electrically to the trellis controller and the zero-patch module for receiving the trellis control output from the trellis controller, and the depunctured systematic code, the depunctured first parity check code and the depunctured second parity check code from the zero-patch module. The turbo decoder is capable of providing the different decoding trellises, and is configured to selectively provide a target one of the different decoding trellises based on the trellis control output and to decode the depunctured systematic code, the depunctured first parity check code and the depunctured second parity check code using the target one of the decoding trellises.

BRIEF DESCRIPTION OF THE DRAWINGS

Other features and advantages of the disclosure will become apparent in the following detailed description of the embodiment with reference to the accompanying drawings, of which:

FIG. 6 exemplarily illustrates an original 196-bit systematic code in the form of a two-dimensional matrix;

FIG. 7 exemplarily illustrates a 184-bit systematic code obtained by puncturing the original 196-bit systematic code of FIG. 6;

FIG. 8 exemplarily illustrates an 89-bit first/second parity check code obtained by puncturing an original 196-bit first/second parity check code;

DETAILED DESCRIPTION

Figure 4:
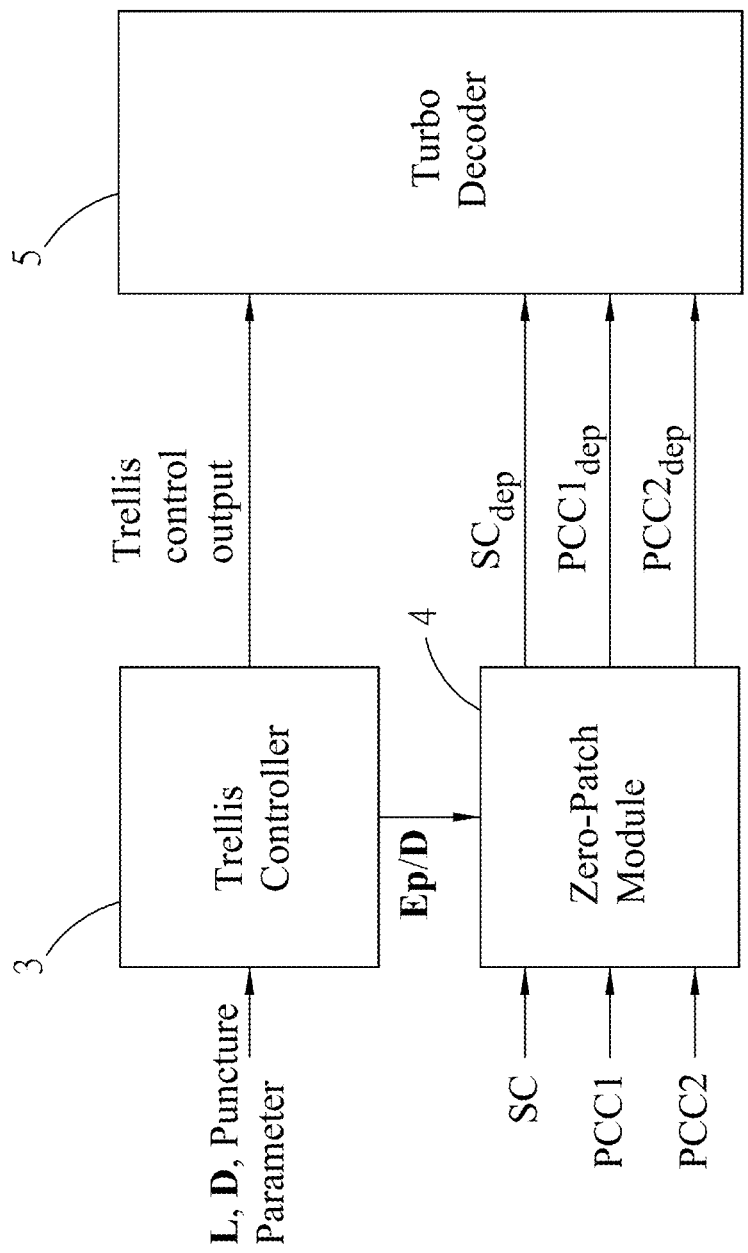
FIG. 4 is a schematic block diagram showing the embodiment of a turbo decoder system according to the disclosure.

Referring to FIG. 4, the embodiment of a turbo decoder system according to this disclosure is used to decode turbo-coded digital data. The turbo-coded digital data corresponds to a transmitted turbo-coded digital data (from a transmitter) that is obtained by puncturing, based on a predetermined wireless communication protocol, an original turbo-coded digital data, which is generated by a turbo encoder of the transmitter. The original turbo-coded digital data includes a D-bit systematic code, and a D-bit first parity check code and a D-bit second parity check code for error correction. In this embodiment, the predetermined wireless communication protocol is, for example, a long term evolution-advanced (LTE-A) protocol. The turbo-coded digital data has an L-bit length, and includes a systematic code (SC), which consists of a plurality of systematic bits, a first parity check code (PCC1), which consists of a plurality of first parity check bits, and a second parity check code (PCC2), which consists of a plurality of second parity check bits. It is noted that the systematic bits of the systematic code (SC) may be extracted from a number K of information bits, and dedicated bits defined by the predetermined wireless communication protocol, for example, four tail bits defined by the LTE-A protocol. The number of the first parity check bits is identical to the number of the second parity check bits.

The turbo decoder system includes a trellis controller 3, a zero-patch module 4 and a turbo decoder 5. In this embodiment, the trellis controller 3 and the zero-patch module 4 cooperatively constitute a device for de-puncturing the turbo-coded digital data to generate depunctured turbo-coded digital data.

The trellis controller 13 is configured to obtain the number Ep of the first/second parity check bits of the firsts second parity check code of the turbo-coded digital data based on L, D, and a puncture parameter from the transmitter, where Ep is a positive integer. The puncture parameter is defined by the predetermined wireless communication protocol, and is associated with the number of punctured bits from the D-bit systematic code of the original turbo-coded digital data. For example, the puncture parameter may be the redundancy version (RV) defined in the LTE-A protocol. The trellis controller 3 calculates the value Ep/D, and generate, based on the code rate of the turbo-coded digital data, a trellis control output that indicates a target one of different decoding trellises. Here, the code rate of the turbo-coded digital data is defined as a ratio of K/L.

In this embodiment, for example, according to the LTE-A protocol, the different decoding trellises include a trellis suitable for a code rate ranging from 1/3 to 1/2, such as the conventional trellis disclosed in the abovementioned fourth article, a period-2 reciprocal dual trellis suitable for a code rate ranging from 1/2 to 2/3, a period-4 reciprocal dual trellis suitable for a code rate ranging from 2/3 to 4/5, a period-8 reciprocal dual trellis suitable for a code rate ranging from 4/5 to 8/9, a period-16 reciprocal dual trellis suitable for a code rate ranging from 8/9 to 16/17, and a period-32 reciprocal dual trellis suitable for a code rate larger than 16/17.

The target decoding trellis may also be determined by the trellis controller 3 based on the value of Ep/D. For example, when $Ep/D \geq 1/2$, the target decoding trellis is the trellis suitable for a code rate ranging from 1/3 to 1/2. When $1/2 > Ep/DL \geq 1/4$, the target decoding trellis is the period-2 reciprocal dual trellis. When $1/4 > Ep/D \geq 1/8$, the target decoding trellis is the period-4 reciprocal dual trellis. When $1/8 > Ep/D \geq 1/16$, the target decoding trellis is the period-8 reciprocal dual trellis. When $1/16 > Ep/D \geq 1/32$, the target decoding trellis is the period-16 reciprocal dual trellis. When $Ep/D < 1/32$, the target decoding trellis is the period-32 reciprocal dual trellis.

The zero-patch module 4 is used to receive the turbo-coded digital data, and is connected electrically to the trellis controller 3 for receiving the value of Ep/D therefrom. The zero-patch module 4 is configured to patch, when there is any punctured bit existing in the systematic code of the turbo-coded digital data, one or more zeros into the systematic code (SC) of the turbo-coded digital data respectively at bit position(s) of the punctured bit(s) (i.e., a zero at the bit position of every punctured bit) to form a depunctured systematic code ($SC_{dep}$), and to patch, based on the value of Ep/D, at least one zero into each of the first and second parity check codes (PCC1, PCC2) of the turbo-coded digital data in a manner that the first parity check bits and the at least one patched zero-bit are arranged in bit-position to form a periodically depunctured first parity check code ($PCC1_{dep}$), and that the second parity check bits and the at least one patched zero-bit are arranged in bit position to form a periodically depunctured second parity check code ($PCC2_{dep}$). In this embodiment, the depunctured systematic code ($SC_{dep}$), the depunctured first parity check code ($PCC1_{dep}$) and the depunctured second parity check code ($PCC2_{dep}$) cooperatively constitute the depunctured turbo-coded digital data that corresponds to the turbo-coded digital data.

As a simple example of zero-patch operation for a punctured 15-bit parity check code, denoted as $P_{00}P_{03}****P_{12}$, by the zero-patch module 4, where "*" denotes a punctured bit, a depunctured 15-bit parity check code is thus obtained as $P_{00}P_{03}00P_{12}**$. Therefore, the zero-patch module 4 can also be deemed as a depuncture mechanism that enables non-periodically punctured codes to be decoded using the reciprocal dual trellis. It is evident from this simple example that every two adjacent ones of the parity check bits ($P_{00}$, $P_{03}$, $P_{12}$) and the patched zero-bits are spaced apart by two punctured bits (*), hence the parity check bits and the patched zero-bits form a periodically depunctured parity check code.

In this embodiment, for the depunctured first/second parity check code ($PCC1_{dep}$/$PCC2_{dep}$), when $Ep/D \geq 1/2$, any two adjacent ones of the first/second parity check bits and the at least one patched zero-bit are successive in bit-position. In this case, the number of the patched zero-bit(s) of the depunctured first/second parity check code ($PCC1_{dep}$/$PCC2_{dep}$) is identical to the number of the punctured bit(s) of the D-bit first second parity check code. When $1/2 > Ep/D \geq 1/4$, any two adjacent ones of the first/second parity check bits and the at least one patched zero-bit are spaced by one bit position. When $1/4 > Ep/D \geq 1/8$, any two adjacent ones of the first/second parity check bits and the at least one patched zero-bit are spaced by three bit positions. When $1/8 > Ep/D \geq 1/16$, any two adjacent ones of the first/second parity check bits and the at least one patched zero-bit are spaced by seven bit positions. When $1/16 > Ep/D \geq 1/32$, any two adjacent ones of the first/second parity check bits and the at least one patched zero-bit are spaced by fifteen bit positions. When $Ep/D < 1/32$, any two adjacent ones of the first/second parity check bits and the at least one patched zero-bit are spaced by thirty-one bit positions.

Figure 1:
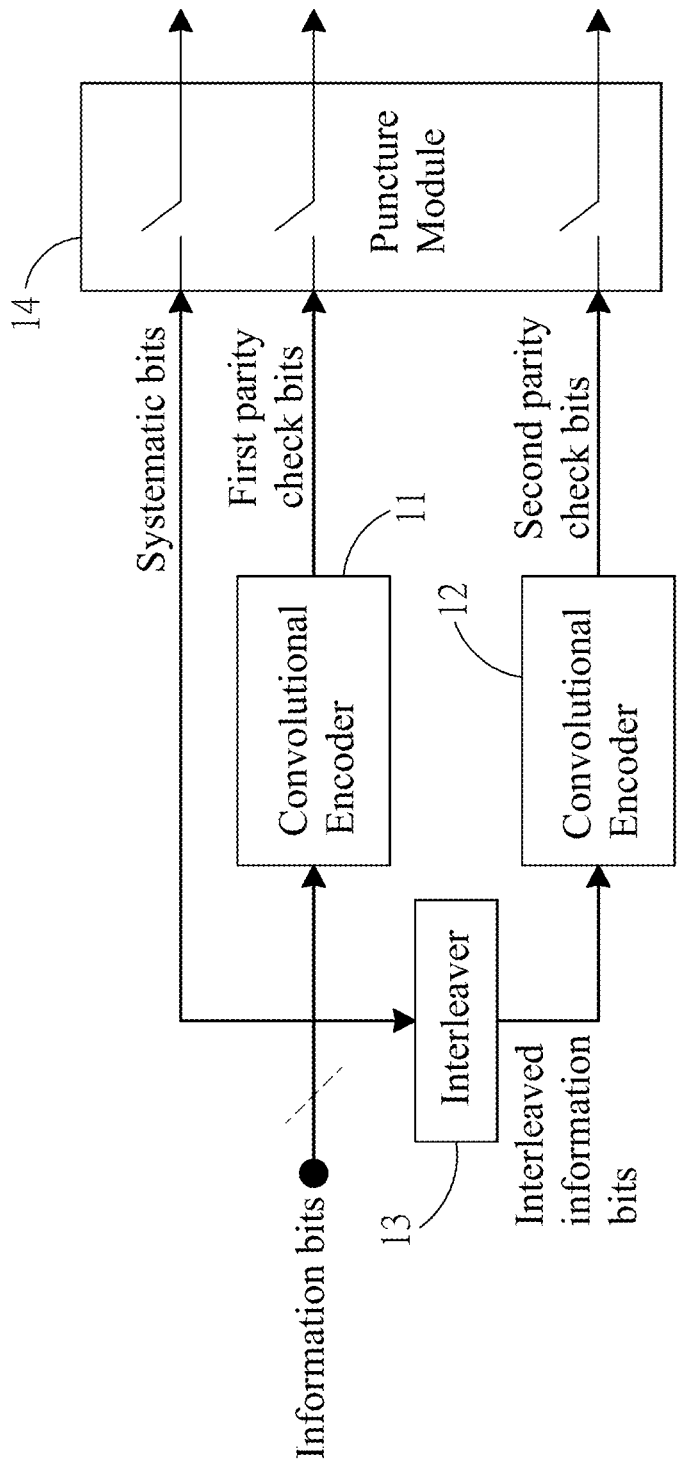
FIG. 1 is a schematic block diagram illustrating a conventional turbo encoder.
Figure 2:
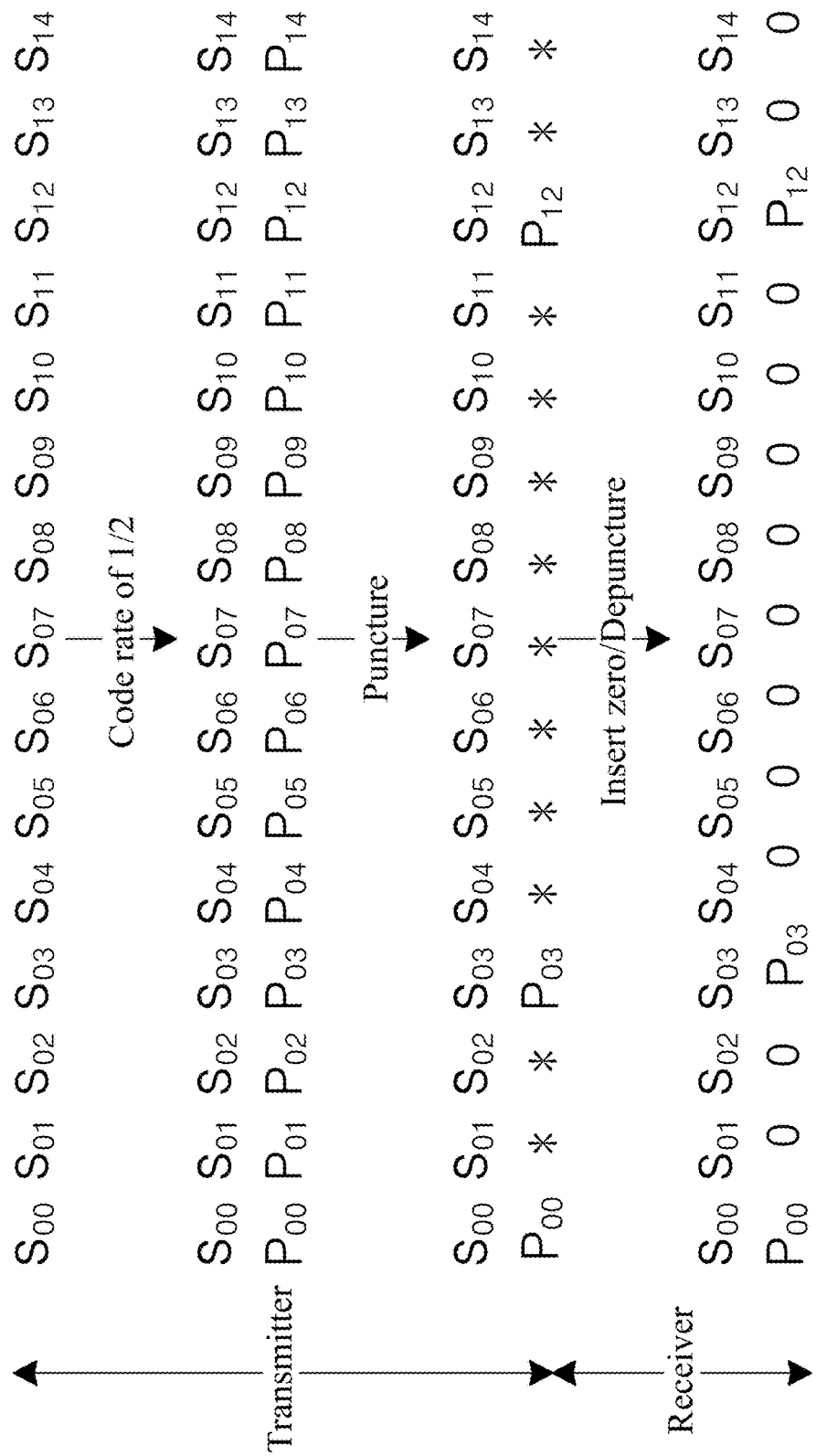
FIG. 2 illustrates an example of encoding, puncturing and de-puncturing operations for a 15-bit data code.
Figure 3:
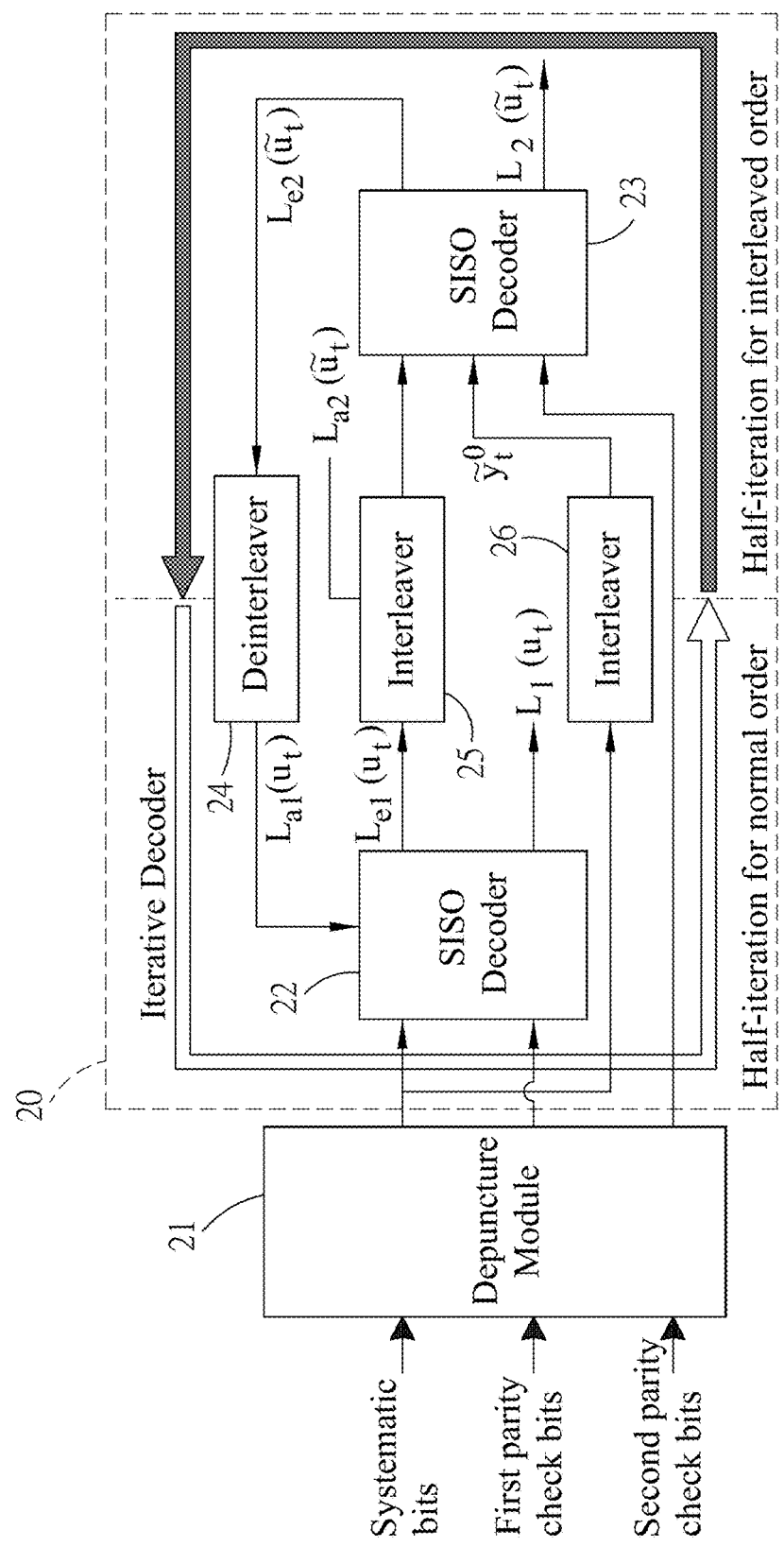
FIG. 3 is a schematic block diagram illustrating a conventional turbo decoder system.

The turbo decoder 5, such as an iterative decoder, is connected electrically to the zero-patch module 4 and the trellis controller 3 for receiving the trellis control output from the trellis controller 3 and the depunctured turbo-coded digital data (i.e., the depunctured systematic code ($SC_{dep}$), the depunctured first parity check code ($PPC1_{dep}$) and the depunctured second parity check code ($PPC2_{dep}$)) from the zero-patch module 4. The turbo decoder 5 is capable of providing the different decoding trellises, and is configured to selectively provide the target one of the different decoding trellises based on the trellis control output and to decode the depunctured systematic code ($SC_{dep}$), the depunctured first parity check code ($PPC1_{dep}$) and the depunctured second parity check code ($PPC2_{dep}$) using the target one of the decoding trellises. In this embodiment, for example, the turbo decoder 5 may have a hardware configuration similar to that of the iterative decoder 20 shown in FIG. 3.

Figure 5:
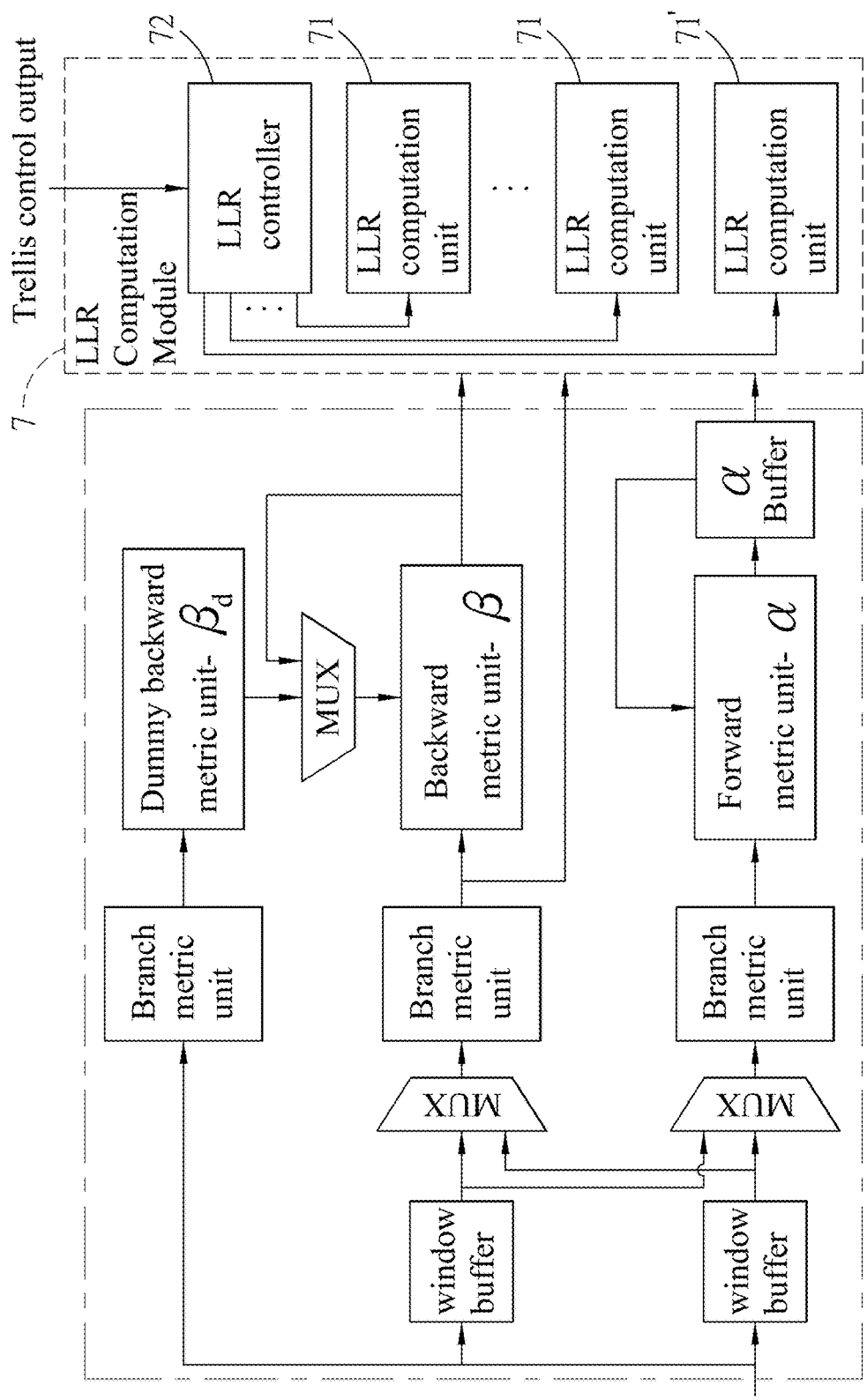
FIG. 5 is a schematic block diagram illustrating exemplarily a SISO decoder of the embodiment.

FIG. 5 illustrates an exemplarily configuration of each SISO decoder included in the turbo decoder 5. The SISO decoder includes some common hardware components encircled by an imaginary line (long-dash-short-dash line) of FIG. 5, and an LLR (log likelihood ratio) computation module 7. Since the feature of this disclosure does not reside in the configurations of the common hardware components, which are known to those in the art, details of the same are omitted herein for the sake of brevity. It should be noted that the LLR computation module 7 includes a plurality of LLR computation units 71, 71', and an LLR controller 72 connected electrically to the LLR computation units 71, 71' and to the trellis controller 3 (not shown in the drawing). In this embodiment, the number of the LLR computation units 71, 71' may be, but not limited to, 32. The LLR controller 72 receives the trellis control output from the trellis controller 3, and is configured to control operations of the LLR computation units 71, 71' based on the trellis control output in a way that the LLR computation unit 71' is normally activated and the number of all activated ones of the LLR computation units 71, 71' is the same as the number of periods of the target decoding trellis indicated by the trellis control output. Therefore, for example, if the target decoding trellis indicated by the trellis control output is the conventional trellis, the common hardware components and the LLR computation unit 71' cooperatively contribute to the conventional trellis in operation. As another example, if the target decoding trellis indicated by the trellis control output is the period-4 reciprocal dual trellis, the common hardware components, the LLR computation unit 71' and another three activated LLR computation units 71 cooperatively contribute to the period-4 reciprocal dual trellis in operation.

Figure 6:
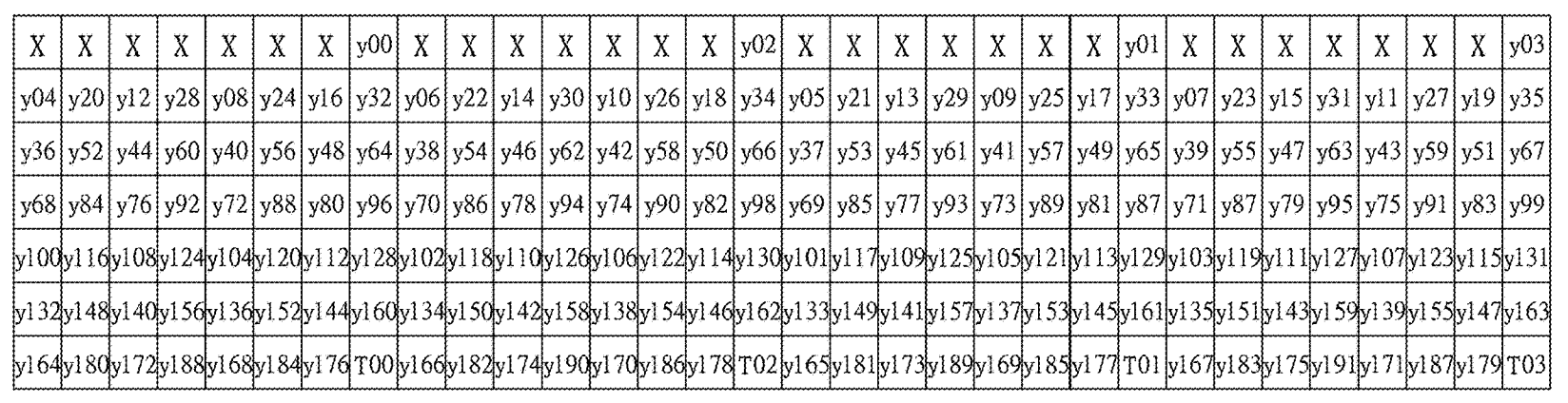
Figure 7:
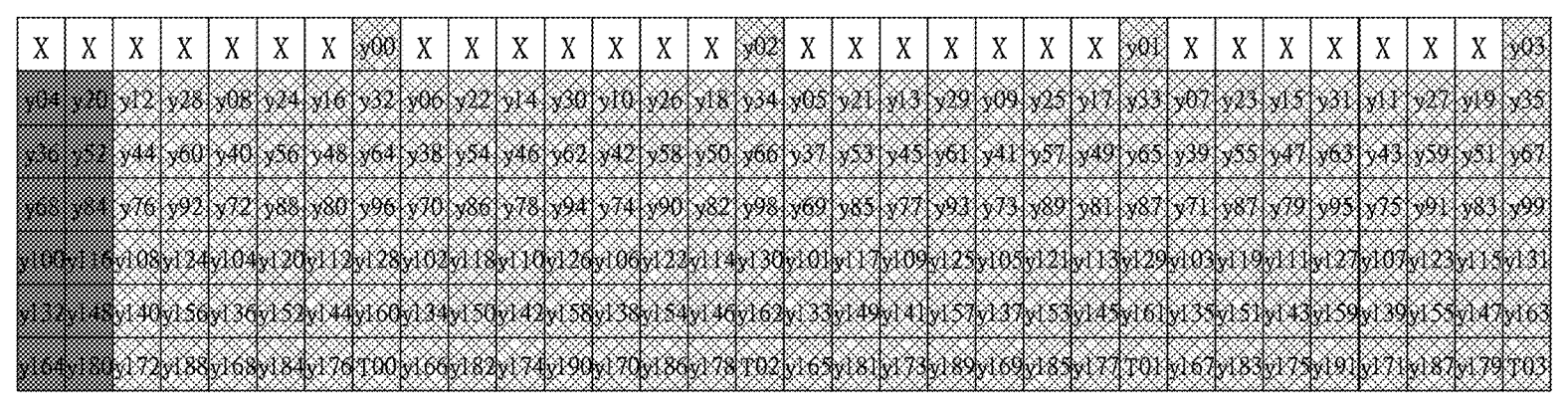
Figure 8:
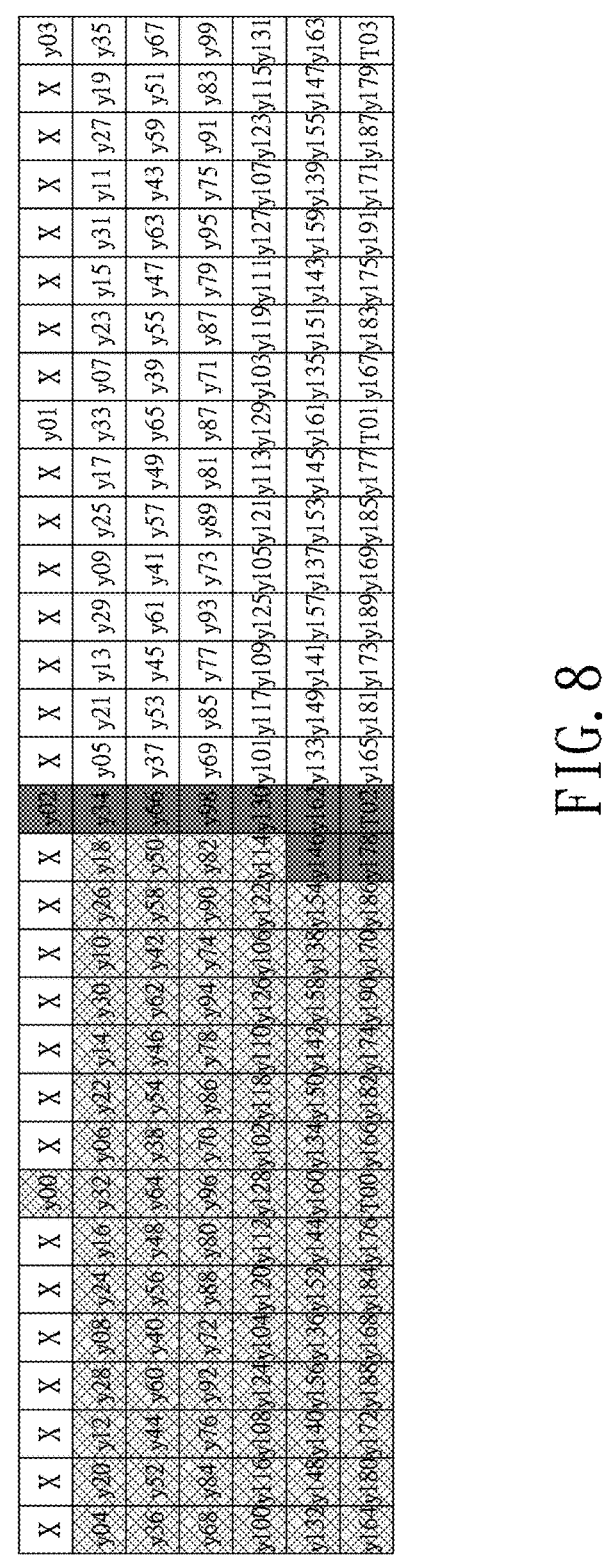

As an example at a transmitter, referring to FIG. 6, an original 196-bit systematic code is shown to be in the form of a two-dimensional matrix that has a SW size (i.e., a number of columns as shown) of 32 and that is obtained after the inter-column permutation operation based on a predetermined rule defined by the LTE-A protocol, wherein "X" denotes a null digit, "y00" to "y191" denote respectively first to $192^{th}$ information bits, and "T00" to "T03" denote respectively first to fourth tail bits. In this example, D=196, and K=192 (=D−4). Similarly, an original 196-bit first/second parity check code corresponding to the original 196-bit systematic code has the same construction as shown in FIG. 6. For transmission of turbo-coded digital data having a 362-bit length, i.e., L=362, based on the puncture parameter of RV=0, a puncture procedure for the original 192-bit systematic code s performed by puncturing twelve bits in the first and second columns of the two-dimensional matrix of FIG. 6, i.e., y04, y36, y68, y100, y132, y164, y20, y52, y84, y116, y148 and y180 located in gray-filled elements of the matrix depicted in FIG. 7, such that a 184-bit punctured systematic code is thus obtained, as indicated by gridded elements of the matrix depicted in FIG. 7. On the other hand, the original 196-bit first/second parity check code is punctured to be an 89-bit punctured first/second parity check code, as indicated by gridded elements of the matrix depicted in FIG. 8. In this case, the 184-bit punctured systematic code, the 89-bit punctured first parity check code and the 89-bit punctured second parity check code cooperatively constitute the turbo-coded digital data to be transmitted to and decoded by the turbo decoder system of this disclosure.

According to the above example, after receipt of the turbo-coded digital data, L, D and the puncture parameter from the transmitter by the turbo decoder system, the trellis controller 3 obtains Ep=89 (=1/2×(362−(196−12))) and the code rate of the turbo-coded digital data being 0.53 (=K/L=192/362), calculates the value of Ep/D to be 0.454 (=89/196), and generates, based on the code rate of 0.53, the trellis control output indicating the period-2 reciprocal dual trellis as the target decoding trellis. Then, the zero-patch module 4 patches twelve zeros into the 184-bit systematic code respectively at bit positions of all the punctured bits, i.e., y04, y36, y68, y100, y132, y164, y20, y52, y84, y116, y148 and y180 located in the gray-filled elements of the matrix depicted in FIG. 7, to form a 196-bit depunctured systematic code. Since 1/2>Ep/D≥1/4, the zero-patch module 4 patches nine zeros into the first/second parity check code respectively at bit positions of nine of the punctured bits, i.e., y146, y178, y02, y34, y66, y98, y130, y162 and T02 located in gray-frilled elements of the matrix depicted in FIG. 8, so that any two adjacent ones of the first/second parity check bits and the patched zero-bits are spaced by one bit position to form a 89-bit depunctured first/second check code. Thereafter, the LLR controller 72 of each SISO decoder of the turbo decoder 5 activates, based on the trellis control output indicating the period-2 reciprocal dual trellis as the target decoding trellis, to perform LLR computation.

Figure 9:
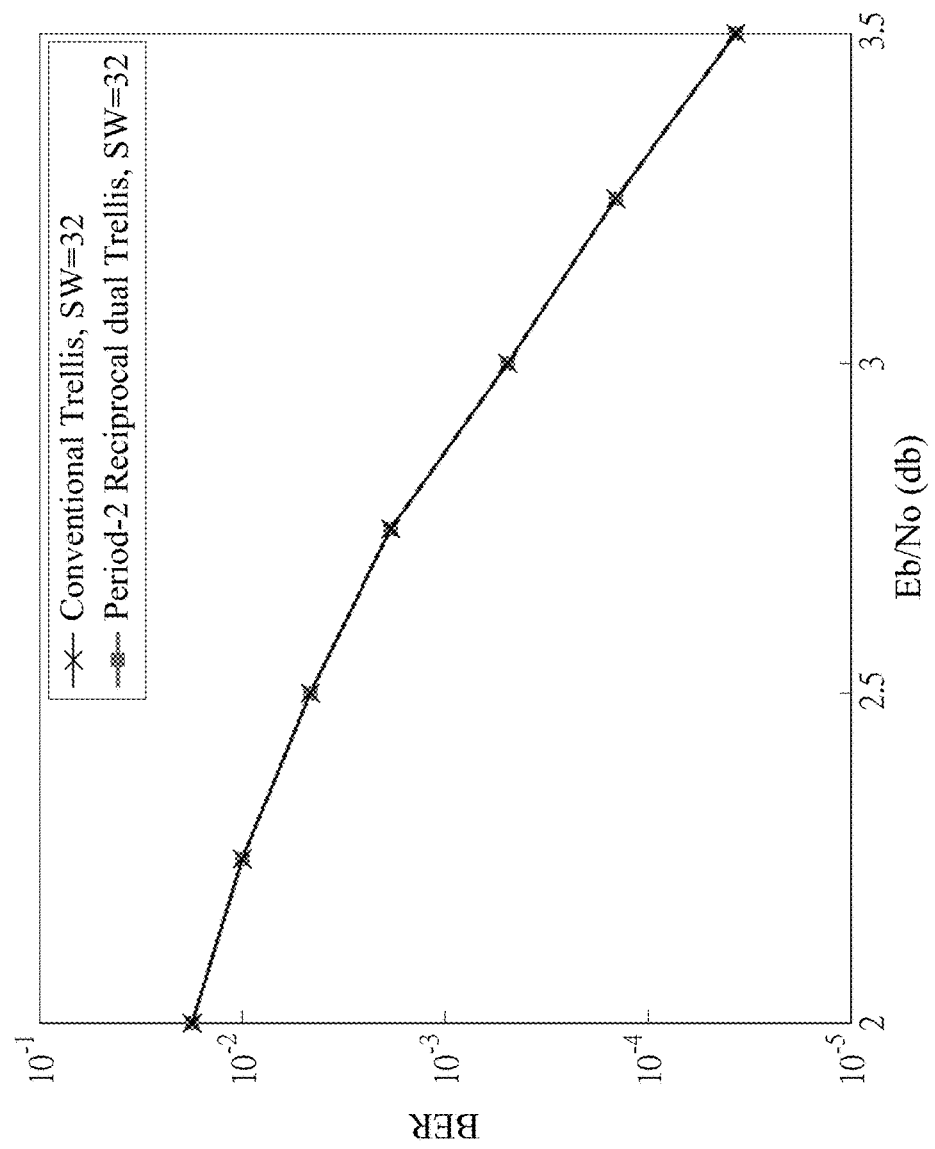
FIG. 9 is a plot exemplarily illustrating simulated BER performances for rate-0.53 turbo-coded digital data obtained with the same SW size of 32 respectively by a conventional turbo decoder with a conventional radix-2 trellis, and the embodiment with a period-2 reciprocal dual trellis.

FIG. 9 exemplarily illustrates simulated bit error rate (PER) performances for the above rate-0.53 turbo-coded digital data, which has been non-periodically punctured, obtained with the same SW size of 32 respectively by a conventional turbo decoder with the conventional radix-2 trellis, and the turbo decoder system with the period-2 reciprocal dual trellis. From FIG. 9, the turbo decoder system of this disclosure can achieve similar PER performance as with the prior art. It is noted that, the SISO decoders with the period-2 reciprocal dual trellis of the turbo decoder system can raise the decoding speed up to about two times the decoding speed of the conventional turbo decoder with the conventional radix-2 trellis.

Figure 10:
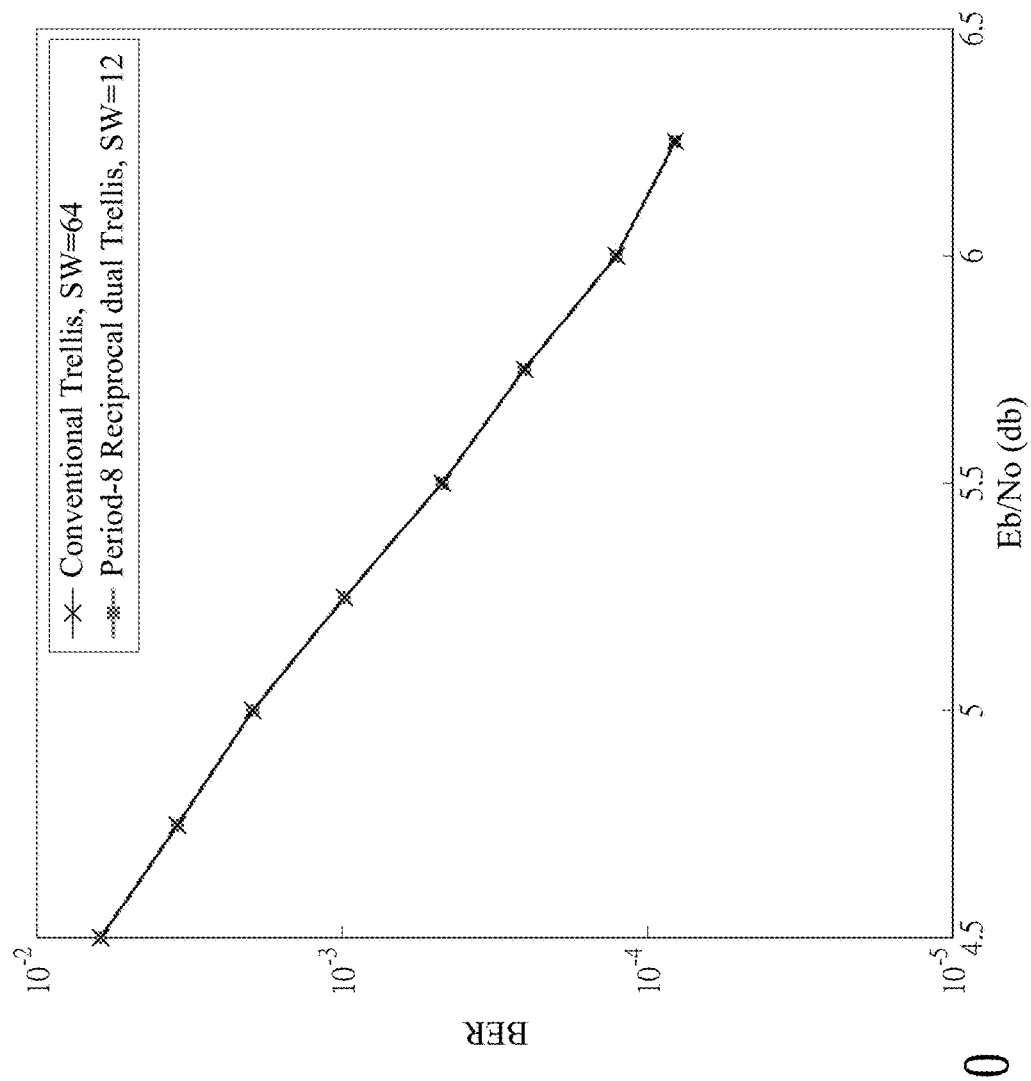
FIG. 10 is a plot exemplarily illustrating simulated BER performances for rate-0.85 turbo-coded digital data obtained respectively by the conventional turbo decoder with the conventional radix-2 trellis with the SW size of 64, and the embodiment with a period-8 reciprocal dual trellis with the SW size of 12.

FIG. 10 exemplarily illustrates simulated bit error rate (BER) performances for another rate-0.85 turbo-coded digital data, which has been non-periodically punctured, obtained respectively by the conventional turbo decoder with the conventional radix-2 trellis with the SW size of 64, and the turbo decoder system with the period-8 reciprocal dual trellis with the SW size of 12. From FIG. 10, the turbo decoder system of this disclosure can achieve similar BER performance as with the prior art. It is noted that, the SISO decoders with the period-8 reciprocal dual trellis of the turbo decoder system can raise the decoding speed up to about eight times the decoding speed of the conventional turbo decoder with the conventional radix-2 trellis.

To sum up, due to the presence of the trellis controller 3 and the zero-patch module 4, the turbo decoder system of this disclosure can decode, using the target decoding trellis with a relatively small size of SW, the non-periodically punctured turbo-coded digital data with its code rate being within a wide range at a relatively fast decoding speed, thereby ensuing relatively high decoding throughout under relatively small circuit area requirement.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A method of de-puncturing turbo-coded digital data implemented by a de-puncturing device, the turbo-coded digital data corresponding to transmitted turbo-coded digital data that is obtained by puncturing original turbo-coded digital data based on a predetermined wireless communication protocol, the original turbo-coded digital data including a D-bit systematic code, and a D-bit parity check code for error correction, the turbo-coded digital data having an L-bit length and including a systematic code, which consists of a plurality of systematic bits, and a parity check code, which consists of a plurality of parity check bits, said method comprising steps of:

a) obtaining, by the de-puncturing device, a number Ep of the parity check bits of the parity check code of the turbo-coded digital data based on L, D, and a puncture parameter defined by the predetermined wireless communication protocol and associated with a number of punctured bits from the D-bit systematic code of the original turbo-coded digital data, where Ep is a positive integer;

b) when there is any punctured bit existing in the systematic code of the turbo-coded digital data, patching, by the de-puncturing device, one or more zeros into the systematic code of the turbo-coded digital data respectively at bit position(s) of the punctured bit(s) to form a depunctured systematic code; and c) patching, by the de-puncturing device, based on the value of Ep/D, at least one zero into the parity check code of the turbo-coded digital data in a manner that the parity check bits and the at least one patched zero-bit are arranged in bit-position to form a periodically depunctured parity check code that cooperates with the depunctured systematic code to constitute depunctured turbo-coded digital data corresponding to the turbo-coded digital data.

2. The method as claimed in claim 1, the predetermined wireless communication protocol being a long term evolution-advanced (LTE-A) protocol, wherein, in step c), for the depunctured parity check code:

when Ep/D≥1/2, any two adjacent ones of the parity check bits and the at least one patched zero-bit are successive in bit-position;

when 1/2>Ep/D≥1/4, any two adjacent ones of the parity check bits and the at least one patched zero-bit are spaced by one bit position;

when 1/4>Ep/D≥1/8, any two adjacent ones of the parity check bits and the at least one patched zero-bit are spaced by three bit positions;

when 1/8>Ep/D≥1/16, any two adjacent ones of the parity check bits and the at least one patched zero-bit are spaced by seven bit positions;

when 1/16>Ep/D≥1/32, any two adjacent ones of the parity check bits and the at least one patched zero-bit are spaced by fifteen bit positions; and when Ep/D<1/32, any two adjacent ones of the parity check bits and the at least one patched zero-bit are spaced by thirty-one bit positions.

3. A device for de-puncturing turbo-coded digital data to generate depunctured turbo-coded digital data, the turbo-coded digital data corresponding to a transmitted turbo-coded digital data that is obtained by puncturing an original turbo-coded digital data based on a predetermined wireless communication protocol, the original turbo-coded digital data including a D-bit systematic code, and a D-bit parity check code for error correction, the turbo-coded digital data having an L-bit length and including a systematic code, which consists of a plurality of systematic bits, and a parity check code, which consists of a plurality of parity check bits, said device comprising:

a trellis controller configured to
  obtain a number Ep of the parity check bits of the parity check code of the turbo-coded digital data based on L, D, and a puncture parameter defined by the predetermined wireless communication protocol and associated with a number of punctured bits from the D-bit systematic code of the original turbo-coded digital data, where Ep is a positive integer,
  calculate the value of Ep/D, and
  generate, based on the code rate of the turbo-coded digital data, a trellis control output that indicates a target one of different decoding trellises to be used by a turbo decoder to decode the depunctured turbo-coded digital data; and a zero-patch module used to receive the turbo-coded digital data, and connected electrically to said trellis controller for receiving the value of Ep/D therefrom, said zero-patch module being configured to
  when there is any punctured bit existing in the systematic code of the turbo-coded digital data, patch one or more zeros into the systematic code of the turbo-coded digital data respectively at bit position(s) of the punctured bit(s) to form a depunctured systematic code, and
  patch, based on the value of Ep/D, at least one zero into the parity check code of the turbo-coded digital data in a manner that the parity check bits and the at least one patched zero-bit are arranged in bit-position to form a periodically depunctured parity check code that cooperates with the depunctured systematic code to constitute the depunctured turbo-coded digital data.

4. The device as claimed in claim 3, wherein:
the predetermined wireless communication protocol is a long term evolution-advanced (LTE-A) protocol; and
for the depunctured parity check code,
  when $Ep/D \geq 1/2$, any two adjacent ones of the parity check bits and the at least one patched zero-bit are successive in bit-position,
  when $1/2 > Ep/D \geq 1/4$, any two adjacent ones of the parity check bits and the at least one patched zero-bit are spaced by one bit position,
  when $1/4 > Ep/D \geq 1/8$, any two adjacent ones of the parity check bits and the at least one patched zero-bit are spaced by three bit positions,
  when $1/8 > Ep/D \geq 1/16$, any two adjacent ones of the parity check bits and the at least one patched zero-bit are spaced by seven bit positions,
  when $1/16 > Ep/D \geq 1/32$, any two adjacent ones of the parity check bits and the at least one patched zero-bit are spaced by fifteen bit positions, and
  when $Ep/D < 1/32$, any two adjacent ones of the parity check bits and the at least one patched zero-bit are spaced by thirty-one bit positions.

5. The device as claimed in claim 4, wherein the different decoding trellises include a trellis suitable for a code rate ranging from 1/3 to 1/2, a period-2 reciprocal dual trellis suitable for a code rate ranging from 1/2 to 2/3, a period-4 reciprocal dual trellis suitable for a code rate ranging from 2/3 to 4/5, a period-8 reciprocal dual trellis suitable for a code rate ranging from 4/5 to 8/9, a period-16 reciprocal dual trellis suitable for a code rate ranging from 8/9 to 16/17, and a period-32 reciprocal dual trellis suitable for a code rate larger than 16/17.

6. The device as claimed in claim 5, wherein:
  when $Ep/D \geq 1/2$, the target decoding trellis is the trellis suitable for a code rate ranging from 1/3 to 1/2;
  when $1/2 > Ep/D \geq 1/4$, the target decoding trellis is the period-2 reciprocal dual trellis;
  when $1/4 > Ep/D \geq 1/8$, the target decoding trellis is the period-4 reciprocal dual trellis;
  when $1/8 > Ep/D \geq 1/16$, the target decoding trellis is the period-8 reciprocal dual trellis;
  when $1/16 > Ep/D \geq 1/32$, the target decoding trellis is the period-16 reciprocal dual trellis; and
  when $Ep/D < 1/32$, the target decoding trellis is the period-32 reciprocal dual trellis.

7. A turbo decoder system for decoding turbo-coded digital data, the turbo-coded digital data corresponding to a transmitted turbo-coded digital data that is obtained by puncturing an original turbo-coded digital data based on a predetermined wireless communication protocol, the original turbo-coded digital data including a D-bit systematic code, and a D-bit first parity check code and a D-bit second parity check code for error correction, the turbo-coded digital data having an L-bit length and including a systematic code, which consists of a plurality of systematic bits, a first parity check code, which consists of a plurality of first parity check bits, and a second parity check code, which consists of a plurality of second parity check bits, said turbo decoder system comprising:

a trellis controller configured to
  obtain a number Ep of the first/second parity check bits of the first/second parity check code of the turbo-coded digital data based on L, D, and a puncture parameter defined by the predetermined wireless communication protocol and associated with a number of punctured bits from the D-bit systematic code of the original turbo-coded digital data, where Ep is a positive integer,
  calculate the value of Ep/D, and
  generate, based on the code rate of the turbo-coded digital data, a trellis control output that indicates a target one of different decoding trellises;

a zero-patch module used to receive the turbo-coded digital data, and connected electrically to said trellis controller for receiving the value of Ep/D therefrom, said zero-patch module being configured to
  when there is any punctured bit existing in the systematic code of the turbo-coded digital data, patch one or more zeros into the systematic code of the turbo-coded digital data respectively at bit position(s) of the punctured bit(s) to form a depunctured systematic code, and
  patch, based on the value of Ep/D, at least one zero into each of the first and second parity check codes of the turbo-coded digital data in a manner that the first parity check bits and the at least one patched zero-bit are arranged in bit-position to form a periodically depunctured first parity check code, and that the second parity check bits and the at least one patched zero-bit are arranged in bit position to form a periodically depunctured second parity check code; and a turbo decoder connected electrically to said trellis controller and said zero-patch module for receiving the trellis control output from said trellis controller, and the depunctured systematic code, the depunctured first parity check code and the depunctured second parity check code from said zero-patch module, said turbo decoder being capable of providing the different decoding trellises, and being configured to provide the target one of the different decoding trellises based on the trellis control output and to decode the depunctured systematic code, the depunctured first parity check code and the depunctured second parity check code using the target one of the decoding trellises.

8. The turbo decoder system as claimed in claim 7, wherein:

the predetermined wireless communication protocol is a long term evolution-advanced (LTE-A) protocol; and for the depunctured first/second parity check code, when $Ep/D \geq 1/2$, any two adjacent ones of the first/second parity check bits and the at least one patched zero-bit are successive in bit-position, when $1/2 > Ep/D \geq 1/4$, any two adjacent ones of the first/second parity check bits and the at least one patched zero-bit are spaced by one bit position, when $1/4 > Ep/D \geq 1/8$, any two adjacent ones of the first/second parity check bits and the at least one patched zero-bit are spaced by three bit positions, when $1/8 > Ep/D \geq 1/16$, any two adjacent ones of the first/second parity check bits and the at least one patched zero-bit are spaced by seven bit positions, when $1/16 > Ep/D \geq 1/32$, any two adjacent ones of the first/second parity check bits and the at least one patched zero-bit are spaced by fifteen bit positions, and when $Ep/D < 1/32$, any two adjacent ones of the first/second parity check bits and the at least one patched zero-bit are spaced by thirty-one bit positions.

9. The turbo decoder system as claimed in claim 8, wherein the different decoding trellises includes a trellis suitable for a code rate ranging from 1/3 to 1/2, a period-2 reciprocal dual trellis suitable for a code rate ranging from 1/2 to 2/3, a period-4 reciprocal dual trellis suitable for a code rate ranging from 2/3 to 4/5, a period-8 reciprocal dual trellis suitable for a code rate ranging from 4/5 to 8/9, a period-16 reciprocal dual trellis suitable for a code rate ranging from 8/9 to 16/17, and a period-32 reciprocal dual trellis suitable for a code rate larger than 16/17.

10. The turbo decoder system as claimed in claim 9, wherein:

when $Ep/D \geq 1/2$, the target decoding trellis is the trellis suitable for a code rate ranging from 1/3 to 1/2;

when $1/2 > Ep/D \geq 1/4$, the target decoding trellis is the period-2 reciprocal dual trellis;

when $1/4 > Ep/D \geq 1/8$, the target decoding trellis is the period-4 reciprocal dual trellis;

when $1/8 > Ep/D \geq 1/16$, the target decoding trellis is the period-8 reciprocal dual trellis;

when $1/16 > Ep/D \geq 1/32$, the target decoding trellis is the period-16 reciprocal dual trellis; and when $Ep/D < 1/32$, the target decoding trellis is the period-32 reciprocal dual trellis.

\* \* \* \* \*